Figure 1:
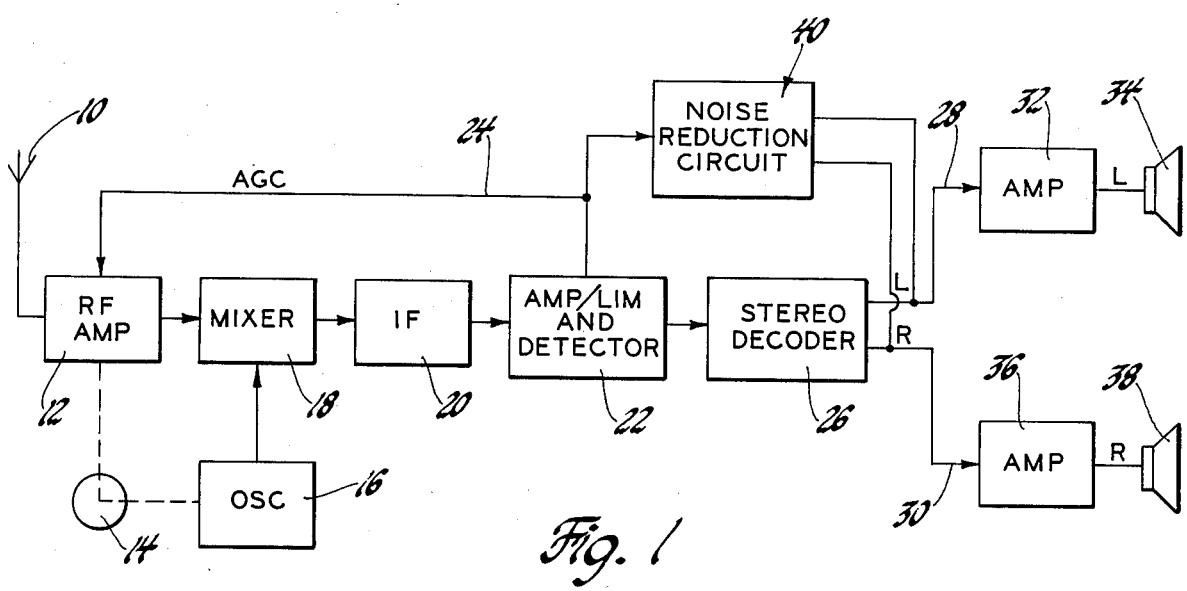

United States Patent [19]

Endres et al.

[11] 4,063,039
[45] Dec. 13, 1977

[54] STEREO NOISE REDUCTION CIRCUIT

[75] Inventors: Thomas E. Endres; Donald W. Rodeman, both of Kokomo, Ind.

[73] Assignee: General Motors Corporation, Detroit, Mich.

[21] Appl. No.: 696,815

[22] Filed: June 16, 1976

[51] Int. Cl.² ............................................. H04H 5/00
[52] U.S. Cl. ............................... 179/15 BT; 325/399; 325/474
[58] Field of Search .................... 179/15 BT; 325/472, 325/474, 475, 476, 479, 399, 402–404

[56] References Cited

U.S. PATENT DOCUMENTS

| 3,673,342 | 6/1972 | Muller | 179/15 BT |
|---|---|---|---|
| 3,823,268 | 7/1974 | Modafferi | 179/15 BT |
| 3,952,161 | 4/1976 | Gilbert et al. | 179/15 BT |

Primary Examiner—Robert L. Griffin
Assistant Examiner—Jin F. Ng
Attorney, Agent, or Firm—Howard N. Conkey

[57] ABSTRACT

A stereo noise reduction circuit is disclosed having circuitry responsive to the automatic gain control voltage generated within an FM stereo receiver for reducing the noise associated with low levels of the RF carrier. A first portion of the noise reduction circuit provides for out-of-phase noise cancellation when the automatic gain control voltage reaches a first level and a second portion provides for rolling-off the higher frequencies of the output audio signals when the automatic gain control voltage reaches a second level.

2 Claims, 2 Drawing Figures

U.S. Patent    Dec. 13, 1977    4,063,039

STEREO NOISE REDUCTION CIRCUIT

This invention relates to FM stereo receivers and, more specifically, to an FM stereo receiver including a noise reduction circuit.

FM stereo receivers are responsive to a transmitted composite stereo signal to provide left and right stereophonically related audio signals. At low RF carrier strength, stereo reception becomes poor in quality because of increasing noise levels from high frequency systems noise, decoding noise, and higher stereo noise caused by wider bandwidth involved in stereo transmission.

Several proposals have been made toward alleviating the problem of poor signal to noise ratios at low carrier strength when operating in the stereo mode. Generally, these proposals involved complex and costly circuits for providing a reduction in the audible noise associated with low carrier strength. Further, noise reduction circuits which operate on the principle of switching as a function of the carrier strength as the carrier strength is varying above and below a switching threshold is objectionable as a result of the switching being audibly discernible to the listener.

It is the general object of this invention to provide for an improved stereo noise reduction circuit.

It is another object of this invention to provide a stereo noise reduction circuit having reduced complexity and cost.

It is another object of this invention to provide an improved stereo noise reduction circuit operated from a system automatic gain control voltage.

In accordance with the present invention, noise reduction is provided by a pair of noise reduction channels each responsive to the automatic gain control voltage generated in the stereophonic receiver. The first channel is responsive to a first level of automatic gain control voltage to progressively forward bias a pair of diodes coupled to the left and right audio output terminals to provide cancellation of the out-of-phase noise associated with the respective channels. The second channel is responsive to a further increase of the automatic gain control voltage associated with a further decrease in the carrier strength to roll-off the higher frequencies of the left and right audio signals to thereby decrease the noise level output of the left and right audio channels.

Figure 2:
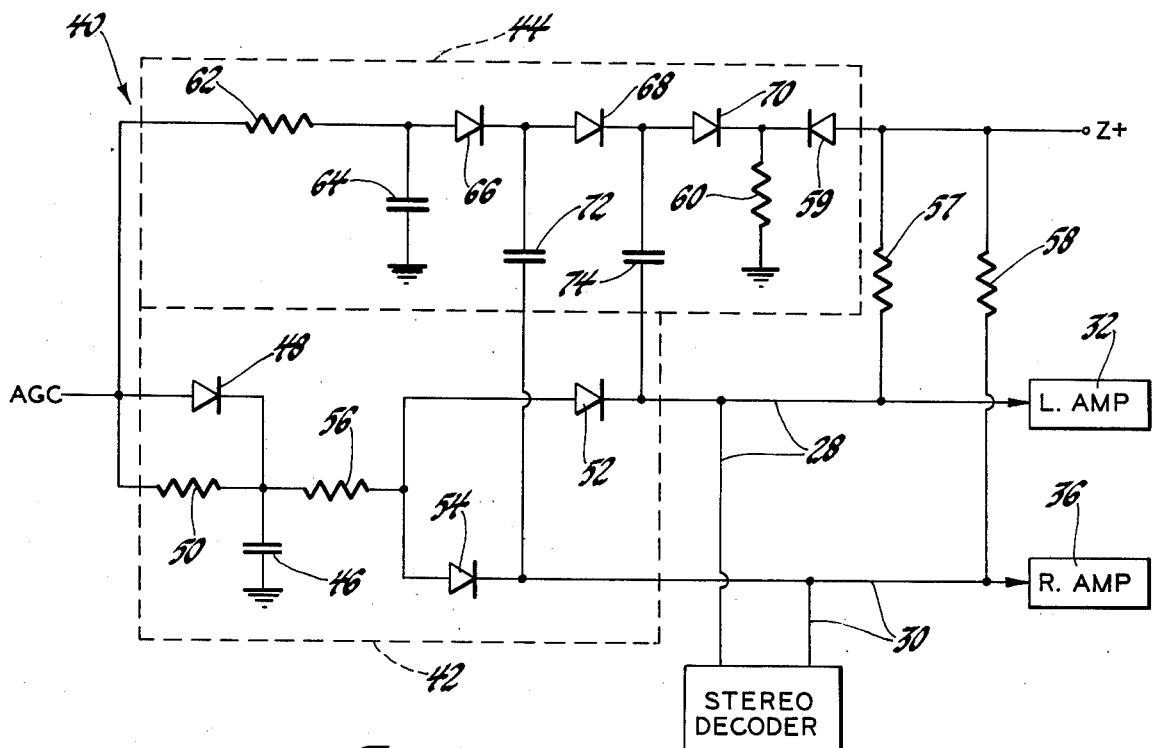

The invention may be best understood by the following description of the preferred embodiment and the drawings in which:

FIG. 1 is a block diagram of an FM stereo receiver incorporating the noise reduction circuit of this invention; and FIG. 2 is a detailed schematic diagram of the noise reduction circuit of this invention.

Referring now to the drawings and initially to FIG. 1, an FM stereo receiver includes an antenna 10 for collecting broadcast signals from the surrounding medium, usually the atmosphere. A radio frequency RF amplifier stage 12 has a relatively broad gain versus frequency response centered about a reception frequency which is tunible via a manually operable tuning knob 14. The RF amplifier stage 12 is responsive to the output of the antenna 10 for amplifying a selected broadcast signal having a carrier frequency coinciding with the reception frequency. A local oscillator stage 16 produces an oscillator signal at an output frequency which is also tunible via the manually operable tuning knob 14 such that the output frequency of the oscillator stage 16 always differs from the reception frequency of the RF amplifier stage 12 by a constant intermediate frequency. A mixer stage 18 is responsive to the output of the RF amplifier stage 12 and the output of the oscillator stage 16 for heterodyning the selected broadcast signal with the oscillator signal to decrease the carrier frequency of the selected broadcast signal to precisely the fixed intermediate frequency.

An intermediate frequency amplifier stage 20 has a relatively narrow gain versus frequency response centered about the intermediate frequency. The IF amplifier stage 20 is responsive to the output of the mixer stage 18 for amplifying the selected broadcast signal. An integrated circuit generally designated 22 includes an amplifier-limiter section and a quadrature-detection section that provide such auxiliary functions as automatic gain control and tuning meter output. A suitable integrated circuit is the RCA--CA3089E disclosed in linear integrated circuit application note ICAN--6257 available from RCA Solid State Division, Box 3200, Somerville, N.J. The application note is incorporated herein by reference. The portion of the circuit 22 which develops the delayed automatic gain control voltage (AGC) is driven by a level detector connected to the first IF stage in the circuit 22. This AGC voltage is coupled back to the RF amplifier 12 on conductor 24 to control the gain of the stage 12 in a manner well known to those skilled in the art. For purposes of describing the noise reduction circuit of this invention, it is sufficient to note that the AGC voltage varies in response to the strength of the received RF carrier signal to control the gain of the RF stage. Consequently, the magnitude of the AGC voltage is representative of the received carrier signal strength. Typically, and for purposes of illustrating the invention, the automatic gain control voltage is small for a high strength carrier signal and increases therefrom as the strength of the carrier signal decreases.

The signal output of the circuit 22 is applied to a stereo decoder 26 which decodes the composite signals to recover the left (L) audio signal on line 28 and the right (R) audio signal on line 30. The L audio signal is applied to a left channel audio amplifier 32 whose output is coupled to a left channel speaker 34. The R audio signal is coupled to a right channel audio amplifier 36 whose output is coupled to the right channel speaker 38.

In accordance with the present invention, the AGC voltage from the circuit 32 is utilized by a noise reduction circuit 40 to reduce the noise in the output of the stereo decoder when received carrier signal strength as represented by the magnitude of the AGC voltage decreases to certain levels.

Referring now to FIG. 2, the noise reduction circuit 40 includes a first noise reduction channel 42 and a second noise reduction channel 44. The first and second noise reduction channels 42 and 44 are each responsive to respective levels of the AGC voltage representing respective low levels of the received carrier signal to provide for noise level reduction. The noise reduction channel 42 is responsive to a first level of AGC voltage representing a first low level of received carrier signal to progressively decrease the separation of the outputs of the stereo decoder 26 so as to provide phase cancellation of the out-of-phase noise signals in the left and right audio outputs thereof. The second noise reduction channel 44 is responsive to a yet higher level of AGC voltage representing a yet lower level of received carrier signal strength to vary the capacitive loading of each output of the stereo decoder 26 to thereby provide for a roll-off in the upper frequency response of the system and provide increased noise reduction.

The first noise reduction channel 42 includes a time-delay capacitor 46 whose charge is controlled by the AGC voltage from the circuit 22 of FIG. 1. In this respect, one side of the capacitor is grounded and the AGC voltage is coupled to the other side thereof through the parallel combination of a diode 48 and a resistor 50, the cathode of the diode 48 being coupled to the capacitor 46.

The diode 48 cooperates with the capacitor 46 to provide a fast charging time constant when the AGC voltage is increasing in response to decreasing levels of the received carrier signal and the resistor 50 cooperates with the capacitor 46 to provide a slow discharge time constant when the automatic gain control voltage is decreasing in response to increasing levels of the received carrier signal.

The charge on the capacitor 46 is coupled to each of the anodes of a diode 52 and a diode 54 through a resistor 56. When the voltage across the capacitor 46 exceeds the DC bias voltage on the left and right channel outputs of the stereo decoder 26 at the anodes of the diodes 52 and 54, the diodes 52 and 54 begin to conduct to decrease the signal separation between the L and R audio outputs of the stereo decoder on lines 28 and 30. The degree of reduction of signal separation is determined by the degree of conduction of the diodes 52 and 54 and consequently the voltage charge on the capacitor 46.

As the diodes 52 and 54 are biased conductive, a reduction in the noise on the output lines 28 and 30 from the stereo decoder 26 is provided as a result of the summation and resultant cancellation of the out-of-phase noise signals on the conductors 28 and 30. As conduction of the diodes 52 and 54 are progressively increased resulting from increasing levels of the automatic gain control voltage, the degree of summation increases to progressively decrease the noise levels resulting from out-of-phase cancellation.

During reception of low carrier signals, the strength may fluctuate rapidly particularly in some applications such as in automobiles where movement of the automobile results in widely fluctuating levels of the carrier signal. The combination of the diode 48 and the resistor 50 provides a rapid response to increasing AGC voltage levels and a slow response to decreasing AGC voltage levels. This prevents an audible fluctuation in the separation between the outputs of the stereo decoder 26 and variation in audible noise levels in response to fluctuating levels of received carrier signals.

The DC bias voltage on the left and right audio output channels from the stereo decoder 26 is determined by the magnitude of load resistors inserted between a regulated voltage Z+ and each of the audio output lines 28 and 30. In this respect, a load resistor 57 is coupled between the regulated voltage Z+ and the output line 28 and a load resistor 58 is coupled between the regulated voltage Z+ and the output line 30. The charge across the capacitor 46 at which the diodes 52 and 54 begin to conduct and consequently the level of the received carrier signal at which noise reduction is initiated by the noise reduction channel 42 can be varied by variation of the value of the resistors 57 and 58.

While the noise reduction channel 42 is effective to reduce the noise present on the output line 28 and 30 of the stereo decoder 26, inasmuch as the noise signals are out of phase, it is desirable to further reduce the noise level when the received carrier signal is at very low levels where the signal-to-noise ratio again becomes objectionably low. To provide for an increased reduction of the noise level at these low levels of the received carrier signal, the noise reduction channel 44 is responsive to the automatic gain control voltage to further reduce the noise level of the audio signals supplied to the audio amplifiers 32 and 36.

The noise reduction channel 44 includes a reference voltage generator which determines the magnitude of AGC voltage at which it becomes effective to further reduce the noise level on the left and right audio output lines 28 and 30 from the stereo decoder 26. This reference voltage generator includes a diode 59 and a resistor 60 series coupled between the regulated voltage Z+ and ground, the reference voltage being the voltage across the resistor 60 which is equal to the voltage Z+ minus the voltage drop across the diode 59. For example, if the diode 58 is a silicon diode it may have a typical voltage drop of 0.7 volts so that the reference voltage is equal to (Z+) − (0.7).

The AGC voltage from the circuit 22 of FIG. 1 is coupled to a low pass filter comprised of a resistor 62 and a capacitor 64. The output of the low pass filter drives three series coupled diodes 66, 68 and 70 which are series coupled between the low pass filter and the reference voltage generator. A loading capacitor 72 is coupled between the junction of the diodes 66 and 68 and the right audio output line 30 of the stereo decoder 36. A loading capacitor 74 is coupled between the junction of the diodes 68 and 70 and the left audio output line 28 of the stereo decoder 26.

The diodes 66, 68 and 70 may be germanium diodes having a voltage drop of, for example, 0.2 volts.

When the AGC voltage increases to a level such that the diodes 66, 68 and 70 conduct (determined by the reference voltage across the resistor 60) representing a very low signal strength, the capacitor 72 is parallel coupled with the load resistor 58 and the capacitor 74 is parallel coupled with the load resistor 57. This capacitive loading is effective to reduce the bandwidth of the system by shorting the high frequency signals and the audibly objectionable high frequency noise associated therewith on the audio output lines 28 and 30 to the positive terminal of the regulated voltage Z+ supply. Consequently, the noise reduction channel 44 reduces the noise level on the audio output lines 28 and 30 of the stereo decoder 26 coupled to the audio amplifier 32 and 36 to increase the signal-to-noise ratio.

The system described is a simplified and inexpensive noise reduction circuit having a first channel responsive to a first low level of received carrier signal strength as represented by the AGC voltage to reduce the noise level by phase cancellation and a second channel responsive to a second lower level of received carrier signal strength as represented by the AGC voltage to further reduce the noise level by shorting the high frequency noise to a reference potential.

The above description of a preferred embodiment of the invention for the purpose of illustrating the principles thereof is not to be considered as limiting or restricting the invention, since many modifications may be made by the exercise of skill in the art without departing from the scope of the invention.

We claim:

1. An FM radio frequency receiver comprising:

means effective to provide left and right stereophonically related audio signals at left and right audio output terminals, said last-mentioned means including a radio frequency amplifier stage and a gain control circuit effective to generate a gain control voltage for controlling the gain of the radio frequency amplifier stage, the magnitude of the gain control voltage being indicative of the strength of a received carrier signal;

a time delay circuit responsive to the gain control voltage effective to supply a variable control signal, the time delay circuit having a first short time delay with a change in the gain control voltage associated with a decreasing strength of the received carrier signal and having a second time delay greater than the first time delay with a change in the gain control voltage associated with an increasing strength of the received carrier signal;

means responsive to the control signal effective to vary the separation between the left and right audio output terminals in accordance with the magnitude of the control signal when the control signal attains a predetermined magnitude resulting from a decreasing strength of the received carrier signal to provide cancellation of the out-of-phase noise on the left and right audio output terminals at low signal strength levels of the received carrier signal, the last-mentioned means including first and second diodes each coupled between the time delay circuit and a respective one of the left and right audio output terminals and being forward biased by the control signal when the control signal attains the predetermined magnitude, the separation between the left and right audio output terminals being decreased rapidly in response to decreasing strengths of the received carrier signal to provide immediate out-of-phase noise cancellation and increased slowly in response to increasing strengths of the received carrier signal to prevent rapid oscillation of separation between the left and right audio output terminals in response to rapid variations in the strength of the received carrier signal.

2. An FM radio frequency receiver comprising:

means effective to provide left and right stereophonically related audio signals at left and right audio output terminals, said last-mentioned means including a radio frequency amplifier stage and a gain control circuit effective to generate a gain control voltage for controlling the gain of the radio frequency amplifier stage, the magnitude of the gain control voltage being indicative of the strength of a received carrier signal;

a time delay circuit responsive to the gain control voltage effective to supply a variable control signal, the time delay circuit having a first short time delay with a change in the gain control voltage associated with a decreasing strength of the received carrier signal and having a second time delay greater than the first time delay with a change in the gain control voltage associated with an increasing strength of the received carrier signal;

means responsive to the control signal effective to vary the separation between the left and right audio output terminals in accordance with the magnitude of the control signal when the control signal attains a predetermined magnitude resulting from the strength of the received carrier signal decreasing to a first signal level to provide cancellation of the out-of-phase noise on the left and right audio output terminals at low signal strength levels of the received carrier signal, the last-mentioned means including first and second diodes each coupled between the time delay circuit and a respective one of the left and right audio output terminals and being forward biased by the control signal when the control signal attains the predetermined magnitude;

means for generating a reference voltage related to the magnitude of the gain control voltage that is indicative of a second signal level of the received carrier signal below the first signal level;

third, fourth, and fifth diodes series coupled between the gain control circuit and the means for generating a reference voltage, said diodes being biased conductive by the gain control voltage when the gain voltage attains the magnitude indicative of the second signal level of the received carrier signal;

a first capacitor coupled between the left audio output terminal and the junction between the fourth and fifth diodes;

a second capacitor coupled between the right audio output terminal and the junction between the third and fourth diodes, the capacitors providing a high frequency roll-off of the audio signals at the right and left audio output terminals to provide for further noise level reduction when the strength of the received carrier signal decreases below the second signal level.

* * * * *